(12) United States Patent
Naghate et al.

(10) Patent No.: US 11,231,883 B1
(45) Date of Patent: Jan. 25, 2022

(54) DETECTING LAST PAGE WRITTEN IN MULTI-PLANE NON-VOLATILE MEMORY

(71) Applicant: Western Digital Technologies, Inc., San Jose, CA (US)

(72) Inventors: Ankit Vijay Naghate, Bengaluru (IN); Rakshit Tikoo, Bengaluru (IN); Yogendra Singh Sikarwar, Bangalore (IN); Ashish Singla, Bengaluru (IN); Arun Thandapani, Bengaluru (IN); Lee M Gavens, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 15 days.

(21) Appl. No.: 16/919,593

(22) Filed: Jul. 2, 2020

(51) Int. Cl.
*G06F 3/00* (2006.01)
*G06F 3/06* (2006.01)
*G11C 16/14* (2006.01)
*G11C 16/26* (2006.01)
*G11C 16/10* (2006.01)

(52) U.S. Cl.
CPC .......... *G06F 3/0659* (2013.01); *G06F 3/0604* (2013.01); *G06F 3/0679* (2013.01); *G11C 16/10* (2013.01); *G11C 16/14* (2013.01); *G11C 16/26* (2013.01)

(58) Field of Classification Search
CPC ......... G06F 12/0246; G06F 2212/7202; G06F 3/0679; G06F 3/064; G06F 3/0611; G06F 3/068; G06F 2212/7211; G06F 3/0605; G06F 3/0656; G06F 3/0659; G06F 11/1072; G06F 2212/7203; G06F 2212/7205; G06F 11/1048; G06F 12/0646; G06F 2212/1032; G06F 2212/7201; G06F 2212/7206; G06F 2212/7207; G06F 3/0619; G06F 3/0653; G06F 2212/1044; G06F 2212/7208
USPC ................ 711/103, E12.008, E12.009, 209; 324/509
See application file for complete search history.

(56) References Cited

U.S. PATENT DOCUMENTS

| | | | |
|---|---|---|---|
| 8,873,285 | B2 | 10/2014 | Sharon et al. |
| 9,361,991 | B1 | 6/2016 | Ng et al. |
| 9,449,700 | B2 | 9/2016 | Shah et al. |
| 9,653,154 | B2 | 5/2017 | Hsu et al. |
| 9,691,452 | B2 | 6/2017 | Pekny et al. |
| 10,552,254 | B2 | 2/2020 | Srinivasan et al. |
| 2012/0297121 | A1* | 11/2012 | Gorobets ............ G06F 12/0246 711/103 |
| 2015/0227314 | A1 | 8/2015 | Chen et al. |
| 2016/0180945 | A1 | 6/2016 | Ng et al. |
| 2016/0240262 | A1 | 8/2016 | Shah et al. |

(Continued)

*Primary Examiner* — Thong Q Le
(74) *Attorney, Agent, or Firm* — Patterson & Sheridan, LLP; Steven H. Versteeg

(57) ABSTRACT

A memory device includes logic to detect the last page written in multi-plane non-volatile memory. The device includes a memory array, and a storage controller. The memory array includes multiple planes and multiple word lines operable on the memory array. The storage controller is configured to divide the word lines into contiguous sub-ranges and assign a subset of the word lines to boundaries of the sub-ranges. Each word line of the subset of word lines is assigned to a page in a different one of the memory planes. The controller operates the subset of word lines to sense a page programmed or erased state from each of the memory planes in parallel.

20 Claims, 15 Drawing Sheets

(56) References Cited

U.S. PATENT DOCUMENTS

| | | |
|---|---|---|
| 2018/0341578 A1 | 11/2018 | Chang |
| 2019/0108090 A1 | 4/2019 | Shen et al. |
| 2019/0227749 A1 | 7/2019 | Wakchaure et al. |

* cited by examiner

DETECTING LAST PAGE WRITTEN IN MULTI-PLANE NON-VOLATILE MEMORY

BACKGROUND

During the initialization process or at other times during operation of electronic memory devices, it may be desirable to identify the last non-erased memory page for various memory areas (e.g., control blocks and host blocks) with reduced latency. For some devices this process may be subject to stringent timing constraints.

Prior approaches to identifying the last non-erased memory page utilize binary search techniques. Binary search has a time complexity of order $\log_2 N$, where N is the number of logical word lines (memory pages). Memory devices may benefit from approaches with reduced complexity and improved performance.

BRIEF SUMMARY

This disclosure relates to a device that detects the last page written in multi-plane non-volatile memory. The device includes a memory array and a storage controller. The memory array includes a plurality of planes. A plurality of word lines is operable on the memory array. The storage controller is configured to divide the word lines into R>2 contiguous sub-ranges and assign a subset of the word lines to boundaries of the sub-ranges. Each word line of the subset of word lines is assigned to a page in a different one of P=R−1 memory planes. The controller operates the subset of word lines to sense a page programmed or erased state from each of the P memory planes in parallel.

This disclosure further relates to a method for detecting the last page written in a multi-plane non-volatile memory. A range of memory pages is divided into R>2 contiguous sub-ranges. A set of pages is assigned at boundaries of the sub-ranges. A storage controller is operated to sense the set of pages at the boundaries across P=R−1 memory planes in parallel. The range of memory pages is then reduced by a factor of P/R.

This disclosure further relates to a memory system that detects the last page written in multi-plane non-volatile memory. The memory system includes a plurality of D memory die. Each of the D memory die includes a plurality of P memory planes. The memory system further includes logic configured to test in parallel for an erased memory page on D*P word lines of a range R of word lines. Different word lines sense different pages from different ones of the memory planes. The logic reduces the range R by a factor of (D*P)/(D*P+1). The logic is configured to repeat the test step and the reduce step until R satisfies a configured condition.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
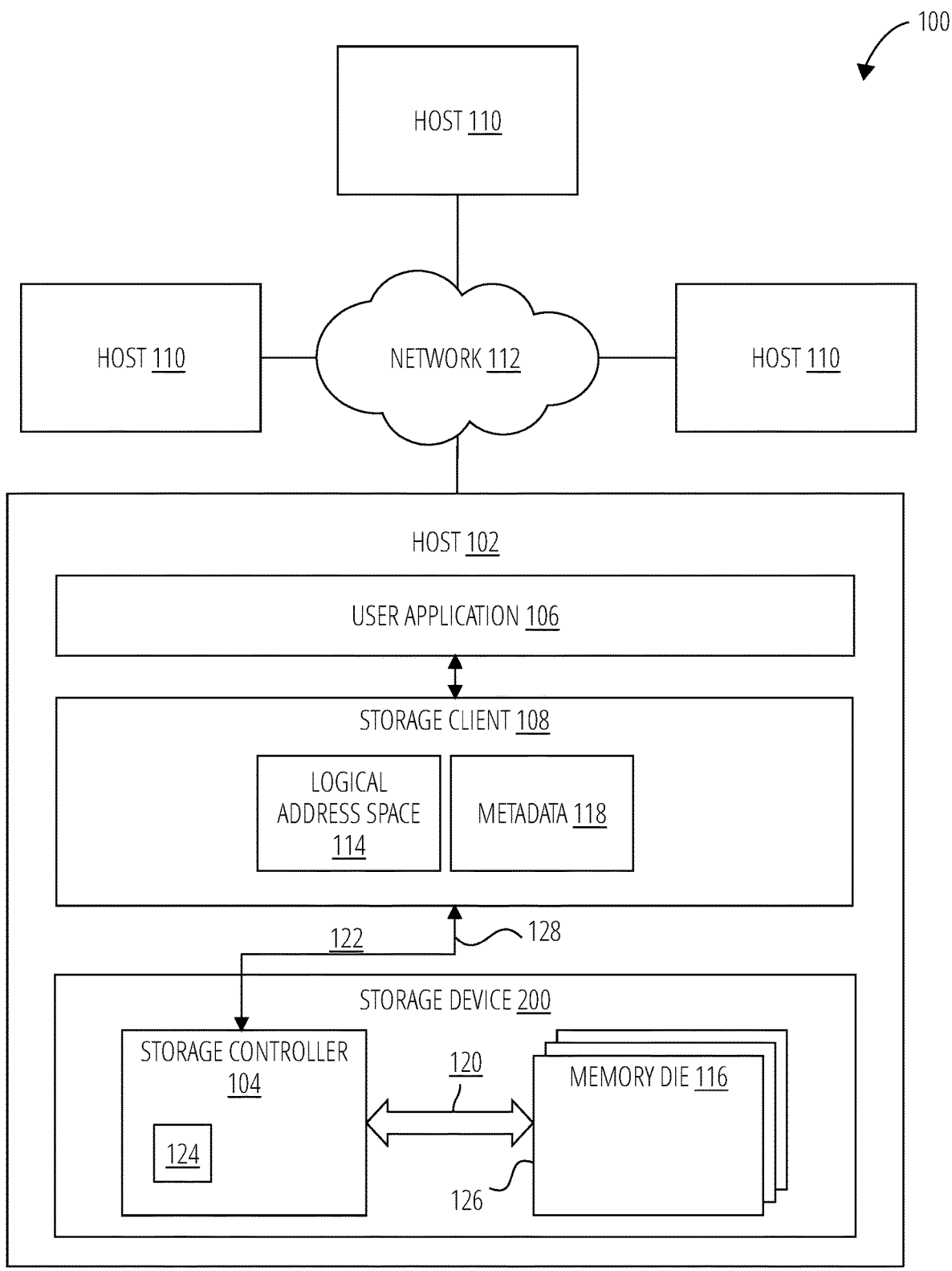
FIG. 1 is a block diagram of a storage system 100 in accordance with one embodiment.

Techniques are disclosed for independent plane read in a memory device to reduce the time to identify a last non-erased page. A parallel read (e.g., sense) is performed on different memory pages of different memory blocks in parallel. "Parallel" refers to two or more operations that overlap in time. Parallel operation includes but is not limited to operations that are co-extensive in time, and also refers to operations that overlap by any time interval. The techniques leverage situations in which memory pages of different planes on the same word line index may be assumed to be programmed (or not programmed) together. Converging more quickly on the last non-erased page (i.e., the last-programmed page) results in reduced initialization times for memory devices.

This disclosure relates to a device that detects the last page written in multi-plane non-volatile memory. The device includes a memory array, and a storage controller. The memory array includes a plurality of planes. A plurality of word lines is operable on the memory array. The storage controller is configured to divide the word lines into R>2 contiguous sub-ranges and assign a subset of the word lines to boundaries of the sub-ranges. Each word line of the subset of word lines is assigned to a page in a different one of P=R−1 memory planes. The controller operates the subset of word lines to sense a page programmed or erased state from each of the P memory planes in parallel.

For example, in one embodiment, the range of word lines may be divided into R=3 sub-ranges over P=2 memory planes, and the range to search for the last-programmed memory page is reduced by P/R=⅔ after each iteration.

A first page on one memory plane and a second page on a different memory plane may define a sub-range. The storage controller may reduce the total range of sub-ranges by a factor of P/R to create a reduced range of word lines to search for the last-programmed page. The storage controller may then divide the reduced range of word lines into R contiguous sub-ranges. The storage controller may switch to performing an alternative search on the plurality of word lines if it detects a predetermined condition, in one embodiment.

The storage controller may execute a sense loop to sense each subset of word lines for a last erased memory page on the P memory planes in parallel. The storage controller may reduce the extent of the sub-ranges by P/R on each iteration of the sense loop. The storage controller may change at least one of the boundaries of the sub-ranges on each iteration of the loop. The storage controller may terminate the sense loop when the extent of the sub-ranges satisfies a configured extent.

This disclosure further relates to a method for detecting the last page written in multi-plane non-volatile memory. A range of memory pages is divided into R>2 contiguous sub-ranges. A set of pages is assigned at boundaries of the sub-ranges. A storage controller is operated to sense the set of pages at the boundaries across P=R−1 memory planes in parallel. The range of memory pages is then reduced by a factor of P/R.

The sub-range boundaries may be assigned to different memory planes. The pages may be programmed contiguously in a sequential order. In one embodiment, the range may include $T_p$ total pages, and each sub-range may include $T_p/R$ pages. Each page in the set of pages may be a physical page of a logical page in a memory meta-block. "Logical page" refers to a collection of physical pages that are treated as a single page for storage operations. A sub-range may in one embodiment be defined by a particular page or word line on one memory plane and a different page or word line on another memory plane. The memory planes may be distributed across a plurality of memory die.

Additionally this disclosure relates to a memory system detecting the last page written in multi-plane non-volatile memory. The memory system includes a plurality of D memory die. Each of the D memory die include a plurality of P memory planes. The memory system further includes logic configured to test in parallel for an erased memory page on D*P word lines of a range R of word lines. Each word line senses a page from a different one of the memory planes. The logic reduces the range R by a factor of (D*P)/(D*P+1).

It will be appreciated that this algorithm may be readily generalized to groups of memory die, groups of memory devices, and so on. For example, to improve input/out performance, a storage controller may group two or more memory die into channels. Such a grouping may be referred to as a flash interface module (FIM). In such a case the algorithm may be expressed as reducing the range R by a factor of (F*D*P)/(F*D*P+1), where F is the number of channels (e.g., FIMs), D is the number of die per channel, and P is the number of planes per die.

The logic is configured to repeat the test step and the reduce step until R satisfies a configured condition. The configured condition may be that R is empty. "Empty" refers to a condition in which two pointers tracking the start and end of a range indicate the range has no content. This may occur when the two pointers have the same value, or when the values of the two pointers cross one another, or when one or more of the pointers takes on a value indicative of being outside a possible extent of the range. The conditions under which a range is empty may be evident and may vary by implementation.

The logic may operate each word line to sense a physical page at a boundary of a configured sub-range of the range. The pages of each of the memory planes may be programmed contiguously in the same sequential order. Pages from different memory planes may form a logical page or may form a memory meta-block.

FIG. 1 is a schematic block diagram illustrating one embodiment of a storage system 100 that may utilize embodiments of the disclosed techniques for identifying a last-programmed memory page in one or more memory blocks. The storage system 100 includes a storage device 200, a storage controller 104, a memory die 116, a host 102, a user application 106, a storage client 108, a logical address space 114, metadata 118, a flash translation layer 124, a data bus 122, a bus 120, at least one host 110, and a network 112.

"Storage client" refers to any hardware, software, firmware, or logic component or module configured to communicate with a storage device in order to use storage services. Examples of a storage client include, but are not limited to, operating systems, file systems, database applications, a database management system ("DBMS"), server applications, a server, a volume manager, kernel-level processes, user-level processes, applications, mobile applications, threads, processes, and the like. "Hardware" refers to functional elements embodied as analog and/or digital circuitry. "Firmware" refers to logic embodied as processor-executable instructions stored on volatile memory media and/or non-volatile memory media. "Software" refers to logic implemented as processor-executable instructions in a machine memory (e.g. read/write volatile memory media or non-volatile memory media). "Logic" refers to memory circuits, non-transitory machine readable media, and/or circuitry which by way of its material and/or material-energy configuration includes control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude electronic memories comprising software and thereby forming configurations of matter).

"Data block" refers to a smallest physical amount of storage space on physical storage media that is accessible, and/or addressable, using a storage command. The physical storage media may be volatile memory media, non-volatile memory media, persistent storage, non-volatile storage, flash storage media, hard disk drive, or the like. Certain conventional storage devices divide the physical storage media into volumes or logical partitions (also referred to as partitions). Each volume or logical partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A data block or cluster represents a smallest physical amount of storage space on the storage media that is managed by a storage controller. A block storage device may associate n data blocks available for user data storage across the physical storage media with a logical block address (LBA), numbered from 0 to n. In certain block storage devices, the logical block addresses may range from 0 to n per volume or logical partition. In conventional block storage devices, a logical block address maps directly to one and only one data block.

"Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

"Storage command" refers to any command relating with a storage operation. Examples of storage commands include, but are not limited to, read commands, write commands, maintenance commands, diagnostic commands, test mode commands, countermeasure command, and any other command a storage controller may receive from a host or issue to another component, device, or system. "Countermeasure command" refers to a storage command configured to implement a countermeasure to mitigate, or reverse, deterioration of a storage block and/or deteriorating storage block health.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory.

While the volatile memory media is referred to herein as "memory media," in various embodiments, the volatile memory media may more generally be referred to as volatile memory.

In certain embodiments, data stored in volatile memory media is addressable at a byte level which means that the data in the volatile memory media is organized into bytes (8 bits) of data that each have a unique address, such as a logical address.

"Memory" refers to any hardware, circuit, component, module, logic, device, or apparatus configured, programmed, designed, arranged, or engineered to retain data. Certain types of memory require availability of a constant power source to store and retain the data. Other types of memory retain and/or store the data when a power source is unavailable.

"Uncorrectable bit error rate" refers to a measure of a rate indicating a number of bits that are that are uncorrectable and in error for a given number of bits that are processed. Bits that are uncorrectable are deemed uncorrectable after one or more error correction techniques are attempted such as use of Error Correction Codes (ECC), use of Bose, Chaudhuri, Hocquenghem (BCH) codes, use of a Low Density Parity Check (LDPC) algorithm, and the like.

"Fail bit count" refers to a measure of a number of bits that are in error for a given unit of measure. Bits that are in error are bits that were stored with one value but then when the same bits where read or sensed the bit indicated a different value. Fail bit counts may be measured for a data block (e.g., 4K), an erase block, a page, a logical erase block, a zone, a namespace, or the like. Said another way, the failed bit count may be a number of bits that differ between data written to a data block, physical erase block, or other grouping of memory cells and data subsequently read from data block, physical erase block, or other grouping of memory cells.

The storage system 100 includes at least one storage device 200, comprising a storage controller 104 and one or more memory die 116, connected by a bus 120. In some embodiments, the storage system 100 may include two or more memory devices. "Storage device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

"Memory die" refers to a small piece of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die or memory die. (Search "die (integrated circuit)" on Wikipedia.com Oct. 9, 2019. Accessed Nov. 18, 2019.)

A memory die is a die, in one embodiment, that includes one or more functional circuits for operating as a non-volatile memory media and/or a non-volatile memory array. "Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may include one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random-access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, non-volatile storage media, storage, non-volatile memory, volatile memory medium, non-volatile storage medium, non-volatile storage, or the like.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

"Non-volatile memory" refers to shorthand name for non-volatile memory media. In certain embodiments, non-volatile memory media refers to the non-volatile memory media and the logic, controllers, processor(s), state machine (s), and/or other periphery circuits that manage the non-volatile memory media and provide access to the non-volatile memory media. "Non-volatile memory array" refers to a set of non-volatile storage cells (also referred to as memory cells or non-volatile memory cells) organized into an array structure having rows and columns. A memory array is addressable using a row identifier and a column identifier.

"Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein.

"Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell includes a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

Each storage device 200 may include two or more memory die 116, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 200 may include other types of non-volatile and/or volatile data storage, such as dynamic RAM ("DRAM"), static RAM ("SRAM"), magnetic data storage, optical data storage, and/or other data storage technologies. The memory die 116 may be configured into a non-volatile memory array 126. "Memory array" refers to a set of storage cells (also referred to as memory cells) organized into an array structure having rows and columns. A memory array is addressable using a row identifier and a column identifier.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

A memory array is addressable using a row identifier and a column identifier. Those of skill in the art recognize that a memory array may include the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The storage device 200, also referred to herein as a storage device, may be a component within a host 102 as depicted in here, and may be connected using a data bus 122, such as a peripheral component interconnect express ("PCIe") bus, a Serial Advanced Technology Attachment ("serial ATA") bus, or the like. In another embodiment, the storage device 200 is external to the host 102 and is connected, a universal serial bus ("USB") connection, an Institute of Electrical and Electronics Engineers ("IEEE") 1394 bus ("FireWire"), or the like. In other embodiments, the storage device 200 is connected to the host 102 using a peripheral component interconnect ("PCI") express bus using external electrical or optical bus extension or bus networking solution such as InfiniBand or PCI Express Advanced Switching ("PCIe-AS"), or the like.

In various embodiments, the storage device 200 may be in the form of a dual-inline memory module ("DIMM"), a daughter card, or a micro-module. In another embodiment, the storage device 200 is a component within a rack-mounted blade. In another embodiment, the storage device 200 is contained within a package that is integrated directly onto a higher-level assembly (e.g., mother board, laptop, graphics processor). In another embodiment, individual components comprising the storage device 200 are integrated directly onto a higher-level assembly without intermediate packaging.

In a further embodiment, instead of being connected directly to the host 102 as DAS, the data storage device 200 may be connected to the host 102 over a data network. For example, the data storage device 200 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 102 and the data storage device 200.

The storage system 100 includes at least one host 102 connected to the storage device 200. "Host" refers to any computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like.

Multiple hosts 102 may be used and may include a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 102 may be a client and the storage device 200 operates autonomously to service data requests sent from the host 102. In this embodiment, the host 102 and storage device 200 may be connected using a computer network, system bus, Direct Attached Storage (DAS) or other communication means suitable for connection between a computer and an autonomous storage device 200.

The depicted embodiment shows a user application 106 in communication with a storage client 108 as part of the host 102. In one embodiment, the user application 106 is a software application operating on or in conjunction with the storage client 108.

The storage client 108 manages files and data and utilizes the functions and features of the storage controller 104 and associated memory die 116. Representative examples of storage clients include, but are not limited to, a server, a file system, an operating system, a database management system ("DBMS"), a volume manager, and the like. The storage client 108 is in communication with the storage controller 104 within the storage device 200. In some embodiments, the storage client 108 may include remote storage clients operating on hosts 110 or otherwise accessible via the network 112. Storage clients may include, but are not limited to operating systems, file systems, database applications, server applications, kernel-level processes, user-level processes, applications, and the like.

The storage client 108 may present a logical address space 114 to the host 102 and/or user application 106. The logical address space 114 may include a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

"Logical address space" refers to a logical representation of memory resources. The logical address space may include a plurality (e.g., range) of logical addresses. "Logical address" refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like. A logical address does not indicate the physical location of data on the storage media but is an abstract reference to the data. "Logical block address" refers to a value used in a block storage device to associate each of n logical blocks available for user data storage across the storage media with an address. In certain block storage devices, the logical block addresses (LBAs) may range from 0 to n per volume or partition. In block storage devices, each LBA maps directly to a particular data block, and each data block maps to a particular set of physical sectors on the physical storage media.

In one embodiment, a device driver for the host 102 (and/or the storage client 108) may maintain metadata 118 within the storage client 108, such as a logical to physical address mapping structure, to map logical addresses of the logical address space 114 to storage locations on the memory die 116. In another embodiment, such metadata 118 may be stored and maintained by a storage controller 104. A device driver may be configured to provide storage services to one or more storage clients.

The storage client 108 may include the flash translation layer 124. "Flash translation layer" refers to logic in a FLASH memory device that includes logical-to-physical address translation providing abstraction of the logical block addresses used by the storage client and the physical block addresses at which the storage controller stores data. The logical-to-physical translation layer maps logical block addresses (LBAs) to physical addresses of data stored on solid-state storage media. This mapping enables data to be referenced in a logical block address space using logical identifiers, such as a block address. A logical identifier does not indicate the physical location of data on the solid-state storage media but is an abstract reference to the data.

The flash translation layer 124 receives the processed data as well as one or more control signals to determine the flash translation layer queue depth. The flash translation layer 124 may determine an appropriate physical address to send data and commands to the memory die 116 and the volatile memory. In certain embodiments, a storage client 108 may include the flash translation layer 124 and may manage metadata 118 associated with the flash translation layer 124. In one embodiment, the flash translation layer 124 also receives the data outputs from the memory die 116.

In one embodiment, the storage system 100 includes one or more clients connected to one or more hosts 110 through one or more computer networks 112. A host 110 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 112 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 112 may also include a network from the IEEE 802 family of network technologies, such Ethernet, token ring, WiFi, WiMax, and the like.

The network 112 may include servers, switches, routers, cabling, radios, and other equipment used to facilitate networking the host 102 or hosts and host 110 or clients. In one embodiment, the storage system 100 includes multiple hosts that communicate as peers over a network 112. In another embodiment, the storage system 100 includes multiple memory devices that communicate as peers over a network 112. One of skill in the art will recognize other computer networks comprising one or more computer networks and related equipment with single or redundant connection between one or more clients or other computer with one or more memory devices or one or more memory devices connected to one or more hosts. In one embodiment, the storage system 100 includes two or more memory devices connected through the network 112 to a host 110 without a host 102.

In one embodiment, the storage client 108 communicates with the storage controller 104 through a host interface comprising an Input/Output (I/O) interface. For example, the storage device 200 may support the ATA interface standard, the ATA Packet Interface ("ATAPI") standard, the small computer system interface ("SCSI") standard, and/or the Fibre Channel standard which are maintained by the Inter-National Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 104 may be configured to store data on one or more asymmetric, write once storage media, such as solid-state storage memory cells within the memory die 116.

"Write once storage media" refers to a storage media such as a storage cell that must be reinitialized (e.g., erased) before new data or a change to the data is written or programmed thereon. In other words, data of a write once storage media cannot be overwritten, the write once storage media must be erased before subsequently writing data to the write once storage media. Read scan operations may not be interruptible or may not be easily interrupted.

As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media). The memory die 116 may be partitioned into memory divisions that can be erased as a group (e.g., erase blocks) in order to, inter alia, account for the asymmetric properties of the memory die 116 or the like.

As such, modifying a single data segment in-place may include erasing the entire erase block comprising the data, and rewriting the modified data to the erase block, along with the original, unchanged data. This may result in inefficient write amplification, which may excessively wear the memory die 116. "Write amplification" refers to a measure of write programming operations performed on a non-volatile storage device which result in writing any data, and user data in particular, more times than initially writing the data in a first instance. In certain embodiments, write amplification may count the number of write operations performed by a non-volatile storage device in order to manage and maintain the data stored on the non-volatile storage device. In other embodiments, write amplification measures the amount of data, the number of bits, written that are written beyond an initial storing of data on the non-volatile storage device.

Therefore, in some embodiments, the storage controller 104 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the main path of a write operation).

Management of a data block by a storage manager includes specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition.

In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 108.

In one embodiment, the storage controller 104 provides a block I/O emulation layer, which serves as a block device interface, or API. In this embodiment, the storage client 108 communicates with the storage device through this block device interface. In one embodiment, the block I/O emulation layer receives commands and logical addresses from the storage client 108 in accordance with this block device interface. As a result, the block I/O emulation layer provides the storage device compatibility with a block storage client 108.

In one embodiment, a storage client 108 communicates with the storage controller 104 through a host interface comprising a direct interface. In this embodiment, the storage device directly exchanges information specific to non-volatile storage devices. "Non-volatile storage device" refers to any hardware, device, component, element, or circuit configured to maintain an alterable physical characteristic used to represent a binary value of zero or one after a primary power source is removed. Examples of a non-volatile storage device include, but are not limited to, a hard disk drive (HDD), Solid-State Drive (SSD), non-volatile memory media, and the like.

A storage device using direct interface may store data in the memory die 116 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 116.

The storage controller 104 receives a logical address and a command from the storage client 108 and performs the corresponding operation in relation to the memory die 116. The storage controller 104 may support block I/O emulation, a direct interface, or both. "Storage controller" refers to any hardware, device, component, element, or circuit configured to manage data operations on non-volatile memory media, and may include one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

Figure 2:
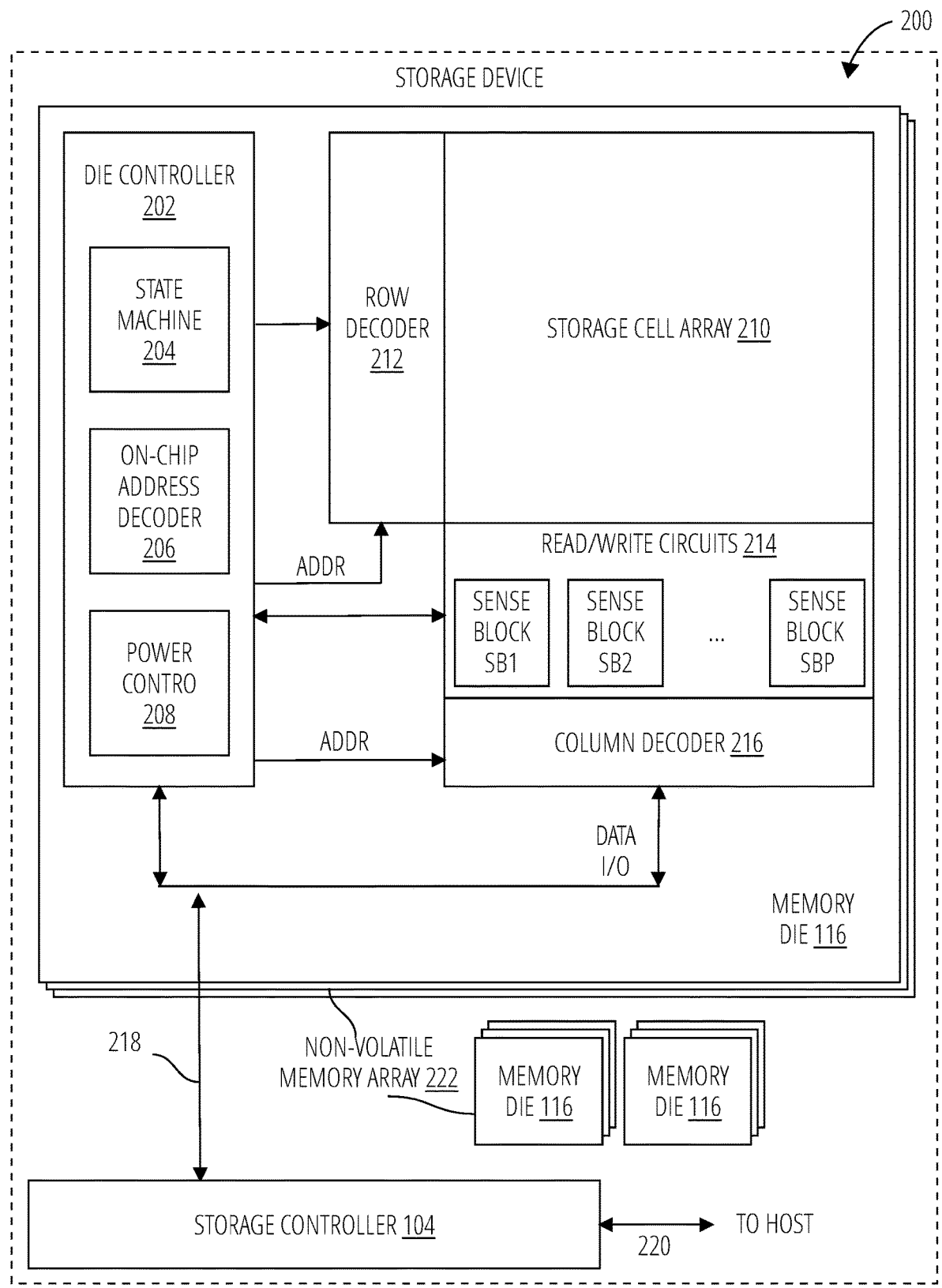
FIG. 2 is a block diagram of a storage device 200 in one embodiment.

FIG. 2 is a block diagram of a storage device 200. The storage device 200 may include a storage controller 104 and a non-volatile memory array 222. Each memory die 116 in the non-volatile memory array 222 may include a die controller 202 and at least one storage cell array 210 in the form of a three-dimensional array, and read/write circuits 214.

The storage cell array 210 is addressable by word line, which corresponds to a row, via a row decoder 212 and by bit line via a column decoder 216. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. The read/write circuits 214 include multiple sense blocks SB1, SB2, . . . , SBp (sensing circuitry) and enable a page of memory cells to be read or programmed in parallel. In certain embodiments, each memory cell across a row of the memory array together form a physical page.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data, such as those to enact storage operation 128, are transferred between the host 102 and storage controller 104 via a data bus 220, and between the storage controller 104 and the one or more memory die 116 via bus 218.

The storage cell array 210 can be two-dimensional (2D—laid out in a single fabrication plane) or three-dimensional (3D—laid out in multiple fabrication planes). The storage cell array 210 may include one or more arrays of memory cells including a 3D array. In one embodiment, the storage cell array 210 may include a monolithic three-dimensional memory structure (3D array) in which multiple memory levels are formed above (and not in) a single substrate, such as a wafer, with no intervening substrates. The storage cell array 210 may include any type of non-volatile memory that is monolithically formed in one or more physical levels of arrays of memory cells having an active area disposed above a silicon substrate. The storage cell array 210 may be in a non-volatile solid-state drive having circuitry associated with the operation of the memory cells, whether the associated circuitry is above or within the substrate.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random-access memory), or circuitry forming a communications device (e.g., a modem, communications switch, or optical-electrical equipment).

Word lines may include sections of the layers containing memory cells, disposed in layers above the substrate. Multiple word lines may be formed on single layer by means of trenches or other non-conductive isolating features.

The die controller 202 cooperates with the read/write circuits 214 to perform memory operations on memory cells of the storage cell array 210, and includes a state machine 204, an address decoder 206, and a power control 208. The state machine 204 provides chip-level control of memory operations.

The address decoder 206 provides an address interface between that used by the host or a storage controller 104 to the hardware address used by the row decoder 212 and column decoder 216. The power control 208 controls the power and voltages supplied to the various control lines during memory operations. The power control 208 and/or read/write circuits 214 can include drivers for word lines, source gate select (SGS) transistors, drain gate select (DGS) transistors, bit lines, substrates (in 2D memory structures), charge pumps, and source lines. In certain embodiments, the power control 208 may detect a sudden loss of power and take precautionary actions. The power control 208 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than storage cell array 210, can be thought of as at least one control circuit or storage controller which is configured to perform the techniques described herein. For example, a control circuit may include any one of, or a combination of, die controller 202, state machine 204, address decoder 206, column decoder 216, power control 208, sense blocks SB1, SB2, . . . , SBp, read/write circuits 214, storage controller 104, and so forth.

In one embodiment, the host 102 is a computing device (e.g., laptop, desktop, smartphone, tablet, digital camera) that includes one or more processors, one or more processor readable storage devices (RAM, ROM, flash memory, hard disk drive, solid-state memory) that store processor readable code (e.g., software) for programming the storage controller 104 to perform the methods described herein. The host may also include additional system memory, one or more input/output interfaces and/or one or more input/output devices in communication with the one or more processors, as well as other components well known in the art.

Associated circuitry is typically used for operation of the memory cells and for communication with the memory cells. As non-limiting examples, memory devices may have circuitry used for controlling and driving memory cells to accomplish functions such as programming and reading.

This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
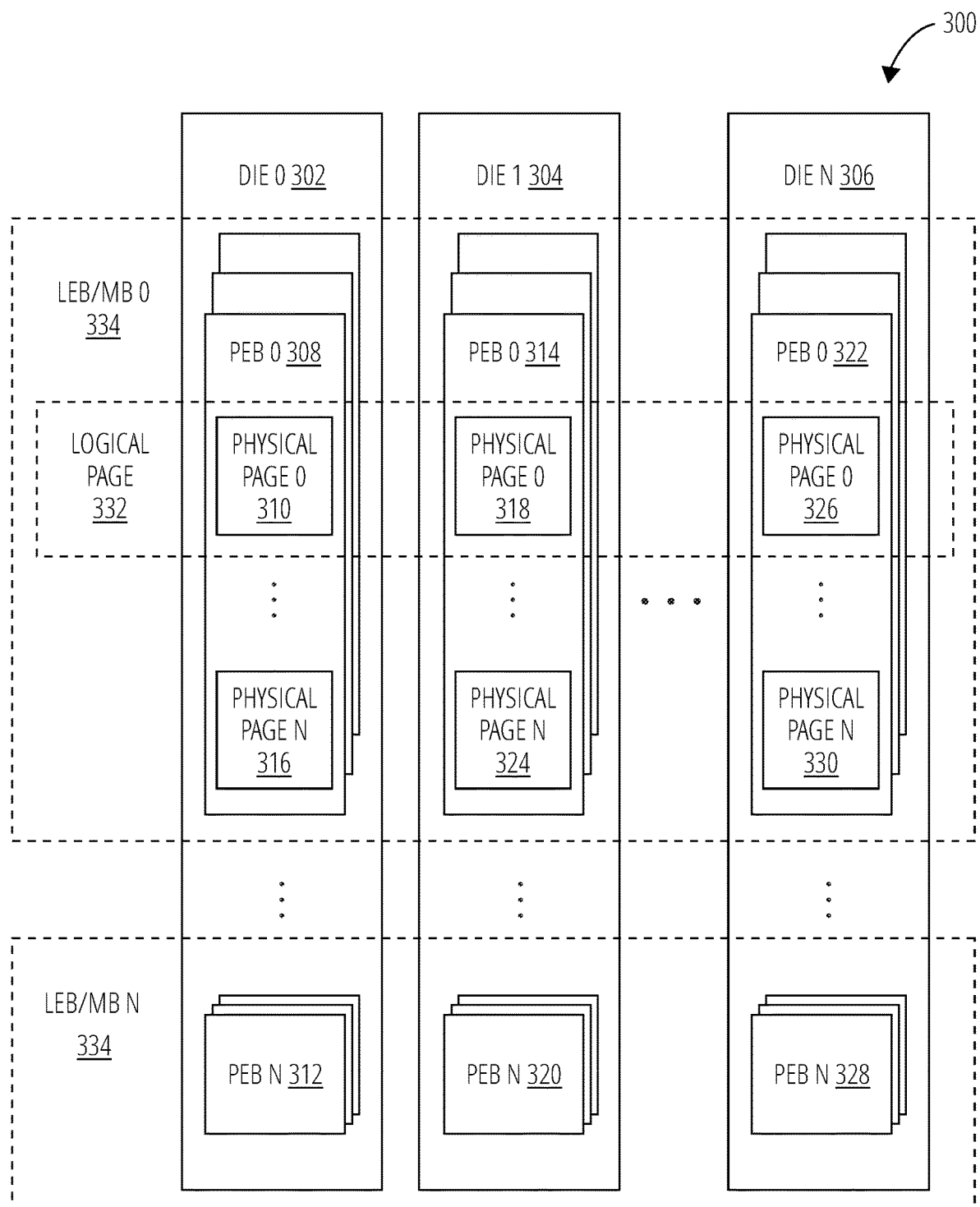
FIG. 3 depicts a memory array 300 in accordance with one embodiment.

FIG. 3 illustrates a memory array 300 in accordance with one embodiment. In the illustrated embodiment, memory array 300 is organized into logical erase blocks (LEBs), as shown by logical erase block 334 (also referred to herein as a "metablock" or "superblock" or "memory meta-block"). These LEBs include multiple physical erase blocks (PEBs) illustrated by physical erase block 0 308, physical erase block n 312, physical erase block 0 314, physical erase block n 320, physical erase block 0 322, and physical erase block n 328. "Physical erase block" refers to smallest storage unit within a given memory die that can be erased at a given time (e.g., due to the wiring of storage cells on the memory die).

The physical erase blocks may be located in separate storage dies, shown as die 0 302, die 1 304, and die n 306. In certain embodiments, a die is divided into planes. A plane may be understood as a division of a die that permits certain storage operations to be performed in parallel using certain physical row addresses and certain physical column addresses.

Those of skill in the art appreciate the relationship and differences between physical erase blocks and a logical erase blocks and may refer to one, or the other, or both by using the shorthand version erase block, block, or storage block. Those of skill in the art understand from the context of the reference to an erase block whether a physical erase block or a logical erase block (or metablock or superblock) is being referred to. The concepts and techniques used in the art and those recited in the claims can be equally applied to either physical erase blocks or logical erase blocks.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block in parallel. It is noted that physical erase blocks within a given logical erase block may be considered as contiguous within a physical address space even though they reside in separate dies. Thus, the term "contiguous" may be applicable not only to data stored within the same physical medium, but also to data stored within separate media.

"Storage block" refers to a set of storage cells organized such that storage operations can be performed on groups of storage cells in parallel. The organization of the set of storage cells may be implemented at a physical level or a logical level. Thus, a storage block, in one embodiment, may include a physical page, such as a word line, a logical page comprising physical pages that span planes and/or memory die, a physical erase block comprising a set of physical pages, a logical erase block (LEB) comprising a set of logical pages, or the like. A storage block may be referred to herein as a "block", a "memory block" or a LEB.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

"Logical erase block" refers to another term for a storage block. In certain embodiments, a logical erase block refers to a set of logical pages that span planes, memory die, and/or chips. This organization of storage cells is deemed 'logical' because the physical pages may not be directly coupled to each other. However, the physical pages are operated in parallel as though they are a single page. In like manner, multiple physical erase blocks may be operated in parallel as though they are a single erase block and are thus referred to as logical erase blocks. The terms logical erase block, metablock, and super block are used interchangeably herein. "Logical page" refers to a collection of physical page that are treated as a single page for storage operations. "Physical page" refers to physical page represents the smallest storage block within a given memory die that can be written to in a single operation.

A logical erase block such as logical erase block 334 is further divided into multiple logical pages (logical page 332) that, in turn, includes multiple physical pages, such as physical page 0 310, physical page n 316, physical page 0 318, physical page n 324, physical page 0 326, and physical page n 330. Physical pages may include multiple packets, which may be grouped into error correction code (ECC) chunks.

In one embodiment, a physical page represents the smallest storage block within a given die that can be written to at a given time. In one embodiment, a logical page is the smallest writable storage block supported by the storage controller. (in one embodiment, the storage controller may include a buffer configured to store up to a logical page worth of data; upon filling the buffer, the storage controller may write the contents of the buffer to a single logical page in parallel.) In some instances, dividing a logical page across multiple dies may result in faster access times for a set of data when multiple dies are accessed in parallel. The logical page configurations may be mapped to any physical page on a die, or across a plurality of memory die, just as with logical erase blocks.

In some embodiments, a storage controller 104 may associate metadata, also referred to as media characteristics, with one or more of the storage blocks (logical erase blocks, physical erase blocks, logical pages, and/or physical pages). The storage controller 104 may manage metadata that identifies logical addresses for which a logical erase block stores data, as well as the respective numbers of stored data packets for each logical erase block, data block, or sector within a logical address space 114 (FIG. 1). A storage controller 104 may store metadata or media characteristic data in a variety of locations, including on non-volatile storage media, in volatile memory, in a structure stored with each logical erase block, or the like.

"Metadata" refers to system data usable to facilitate operation of non-volatile storage device. Metadata stands in contrast to, for example, data produced by an application (i.e., "application data"), a user, a host, or forms of data that would be considered by an operating system as "user data."

For example, a logical erase block may include metadata specifying, without limitation, usage statistics (e.g., the number of program erase cycles performed on that logical erase block, health statistics (e.g., a value indicative of how often corrupted data has been read from that logical erase block), security or access control parameters, sequence information (e.g., a sequence indicator), a persistent metadata flag (e.g., indicating inclusion in an atomic storage operation), a transaction identifier, or the like. In some embodiments, a logical erase block includes metadata identifying the logical addresses for which the logical erase block stores data, as well as the respective numbers of stored data blocks/packets for each logical block or sector.

In certain embodiments, the metadata includes a cross temperature for logical erase block, an average cross temperature for open logical erase blocks of the non-volatile storage device, a temperature change rate, an average program erase count for a logical erase block, an uncorrectable bit error rate (UBER) for a logical erase block, a bit error rate, a fail bit count for a logical erase block, and a charge leak rate. In one embodiment, metadata may include a media characteristic. "Charge leak rate" refers to a rate at which charge leaks from a memory cell when the memory cell is in a passive state, not being read or written to.

Figure 4:
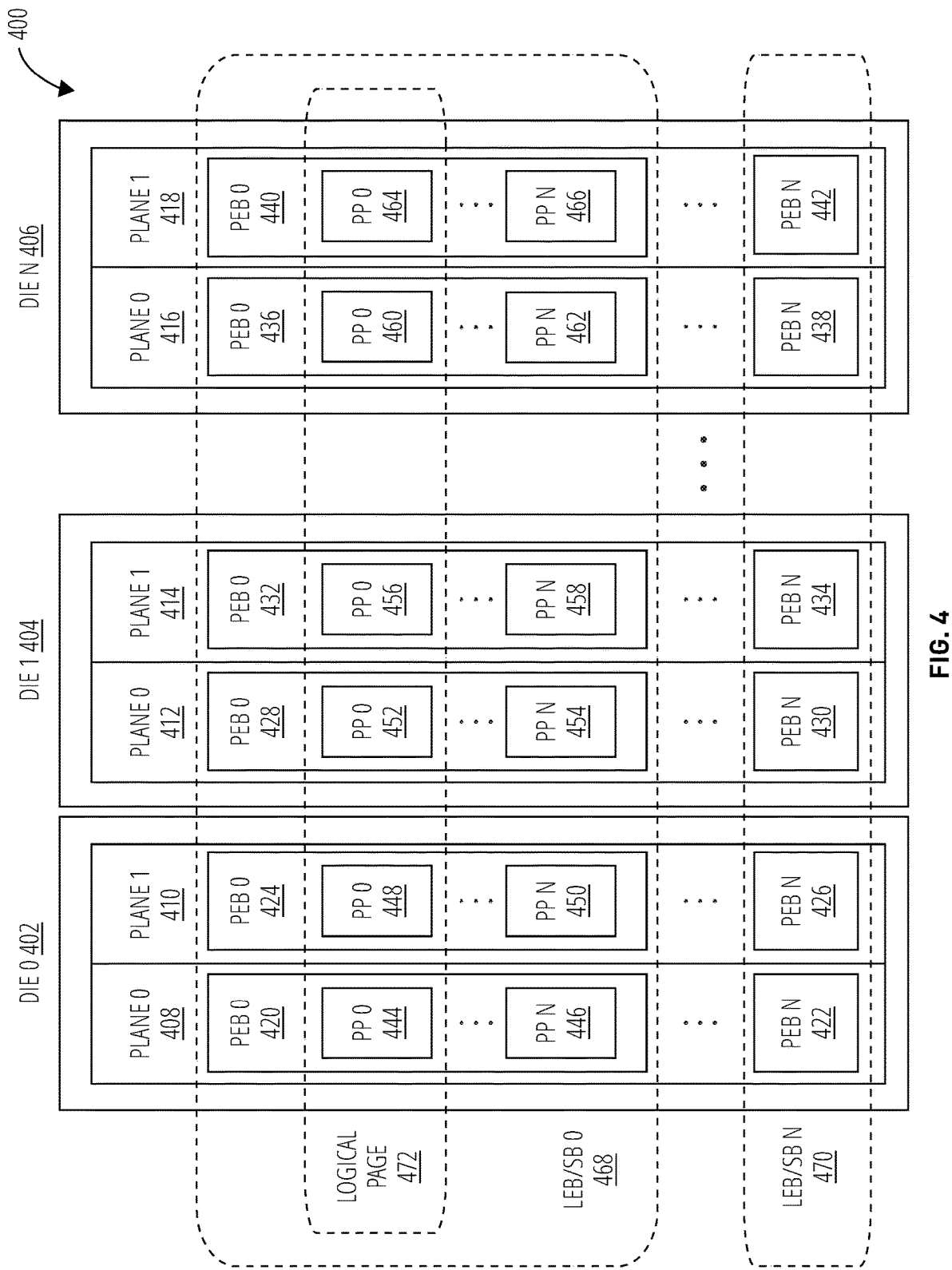
FIG. 4 depicts a memory array 400 in accordance with one embodiment.

FIG. 4 depicts more details of a memory array 400 organization in accordance with one embodiment. The memory array 400 includes a plurality of memory die, such as die 0 402, die 1 404, etc., through die n 406. The example depicts a die that is divided into physical planes, such as plane 0 408 and plane 1 410 of die 0 402, plane 0 412 and plane 1 414 of die 1 404, etc., through plane 0 416 and plane 1 418 of die n 406.

Each plane may be divided into physical erase blocks, as illustrated by physical erase block 0 420 through to physical erase block n 422 of plane 0 408, physical erase block 0 424 through to physical erase block n 426 of plane 0 plane 1 410, physical erase block 0 428 through to physical erase block n 430 of plane 0 412, physical erase block 0 432 through to physical erase block n 434 of plane 0 plane 1 414, physical erase block 0 436 through to physical erase block n 438 of plane 0 416, and physical erase block 0 440 through to physical erase block n 442 of plane 0 plane 1 418.

Each physical erase block can be divided into physical pages. For example, physical erase block 0 420 may include physical page 0 444 through physical page n 446, physical erase block 0 424 may include physical page 0 448 through physical page n 450, physical erase block 0 428 may include physical page 0 452 through physical page n 454, physical erase block 0 432 may include physical page 0 456 through physical page n 458, physical erase block 0 436 may include physical page 0 460 through physical page n 462, physical erase block 0 440 may include physical page 0 464 through physical page n 466.

The memory array 400 is further organized into logical erase blocks (LEBs), as shown by logical erase block/ storage block 0 468 and logical erase block/storage block N 470 (also referred to herein as a "metablock" or "storage block"). These LEBs include multiple physical erase blocks (PEBs) illustrated by physical erase block 0 420, physical erase block n 422, etc. The physical erase blocks may be located in separate storage dies, shown as die 0 402, die 1 404, and die n 406.

Those of skill in the art appreciate the relationship and differences between physical erase blocks and a logical erase blocks and may refer to one, or the other, or both by using the shorthand names such as erase block, block, or storage block. Those of skill in the art understand from the context of the reference to an erase block whether a physical erase block or a logical erase block (or metablock or superblock) is being referred to. The concepts and techniques used in the art and those recited in the claims can be equally applied to either physical erase blocks or logical erase blocks.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

A logical erase block such as logical erase block/storage block 0 468 or logical erase block/storage block N 470 is further divided into multiple logical pages (logical page 472) that, in turn, includes multiple physical pages, such as physical page 0 444, physical page 0 448, physical page 0 452, physical page 0 456, physical page 0 460, and physical page 0 464, as illustrated. Physical pages may include multiple packets, which may be grouped into error correction code (ECC) chunks.

In one embodiment, a physical page represents the smallest storage block within a given die that can be written to at a given time. In one embodiment, a physical page may include a single word line.

In another embodiment, a logical page is the smallest writable storage block supported by the storage controller. (in one embodiment, the storage controller may include a buffer configured to store up to a logical page worth of data; upon filling the buffer, the storage controller may write the contents of the buffer to a single logical page simultaneously.) In certain embodiments, a logical page may be referred to simply as a word line, with the understanding that the logical page includes one word line on each plane and/or memory die of the memory array 400.

In certain embodiments, the logical page spans planes within a memory die or spans planes within multiple memory die. In some instances, dividing a logical page across multiple dies may result in faster access times for a set of data when multiple dies are accessed in parallel. The logical page configurations may be mapped to any physical page on a die, or across a plurality of memory die, just as with logical erase blocks.

For example, a logical erase block may include metadata specifying, without limitation, usage statistics (e.g., the number of program erase cycles performed on that logical erase block, health statistics (e.g., a value indicative of how often corrupted data has been read from that logical erase block), security or access control parameters, sequence information (e.g., a sequence indicator), a persistent metadata flag (e.g., indicating inclusion in an atomic storage operation), a transaction identifier, or the like. In some embodiments, a logical erase block includes metadata identifying the logical addresses for which the logical erase block stores data, as well as the respective numbers of stored data blocks/packets for each logical block or sector.

In certain embodiments, the metadata includes one or more of a cross temperature for logical erase block, an average cross temperature for open logical erase blocks of the non-volatile storage device, a temperature change rate, an average program erase count for a logical erase block, an uncorrectable bit error rate (UBER) for a logical erase block, a bit error rate, a fail bit count for a logical erase block, and a charge leak rate. In one embodiment, metadata may include a media characteristic.

Figure 5A:
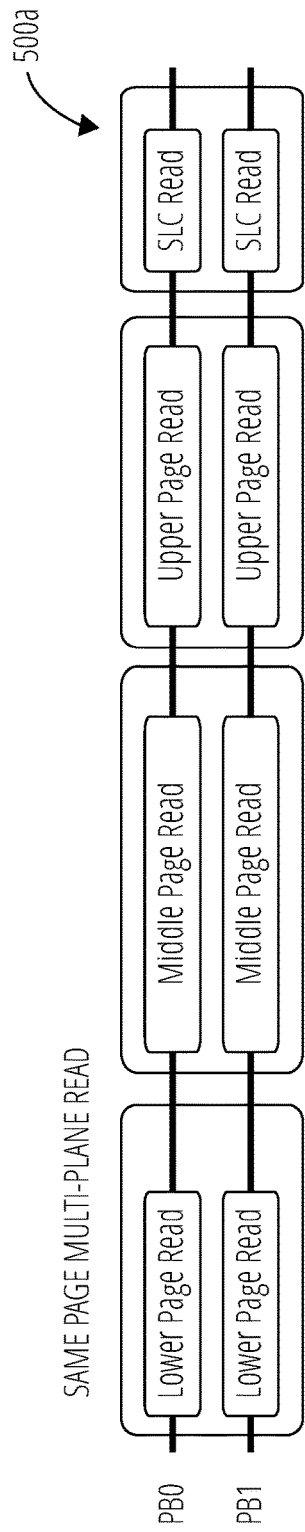
FIG. 5A depicts a multi-plane read 500a in accordance with one embodiment.
Figure 5B:
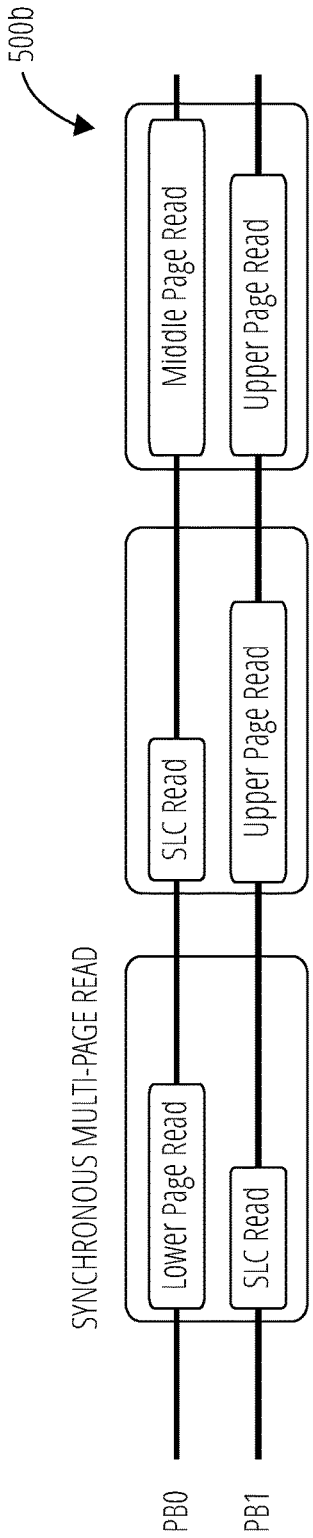
FIG. 5B depicts multi-plane read 500b in accordance with one embodiment.
Figure 5C:
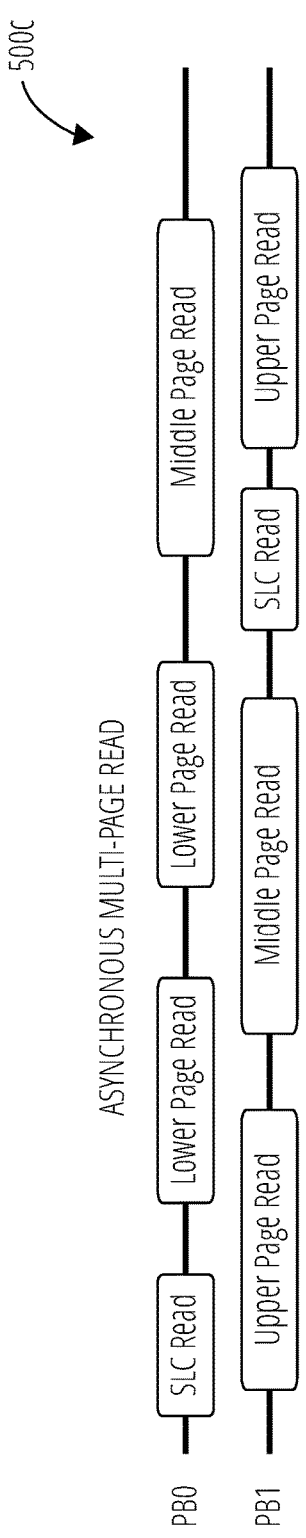
FIG. 5C depicts multi-plane read 500c in accordance with one embodiment.

Various techniques for reading from multiple memory planes in parallel are depicted in FIG. 5A, FIG. 5B, and FIG. 5C. In each of these figures the horizontal axis through the blocks represents time and the vertical axis through the blocks represents a storage block being read from. PB0 and PB1 stand for "physical block on plane 0" and "physical block on plane 1", respectively. In some cases PB0 and PB1 may form a meta-block or logical block, but they may also represent a block and a duplicate block (e.g., for control settings). The techniques disclosed herein may be utilized with the multi-plane read 500*b* approach or the multi-plane read 500*c* approach, although in some implementations the multi-plane read 500*c* approach (due to greater autonomy between the plane reads) may provide improved performance over the multi-plane read 500*b* approach.

FIG. 5A depicts a multi-plane read 500*a* in which synchronous reads across different planes of the same memory die are confined to the same page.

FIG. 5B depicts a process known as multi-plane read 500*b* in which different pages may be read synchronously and in parallel from different planes of a die.

FIG. 5C depicts a multi-plane read 500*c* in which different pages on different memory planes of a die may be read asynchronously and in parallel.

In each figure the x-axis represents time and the y-axis represents the physical erase block being used in the operation, indexed either 0 or 1. PB0 and PB1 stand for "physical block on plane 0" and "physical block on plane 1", respectively. PB0 and PB1 may form a memory meta-block (e.g., storage block). form a meta-block. Alternatively, for example for control blocks (blocks comprising control information for a storage controller or die controller, rather than user data), PB0 and PB1 may be duplicate blocks (for redundancy and robustness).

Either of the multi-plane read 500*b* and multi-plane read 500*c* may be utilized with the techniques disclosed herein, and both provide the capability to read pages (e.g., TLC or SLC) in parallel from different planes on a memory die without constraints on word line or page address between the planes. Due to it's more asynchronous nature the multi-plane read 500*c* may achieve a performance benefit when one of the parallel plane page reads finishes sooner than other.

Figure 6A:
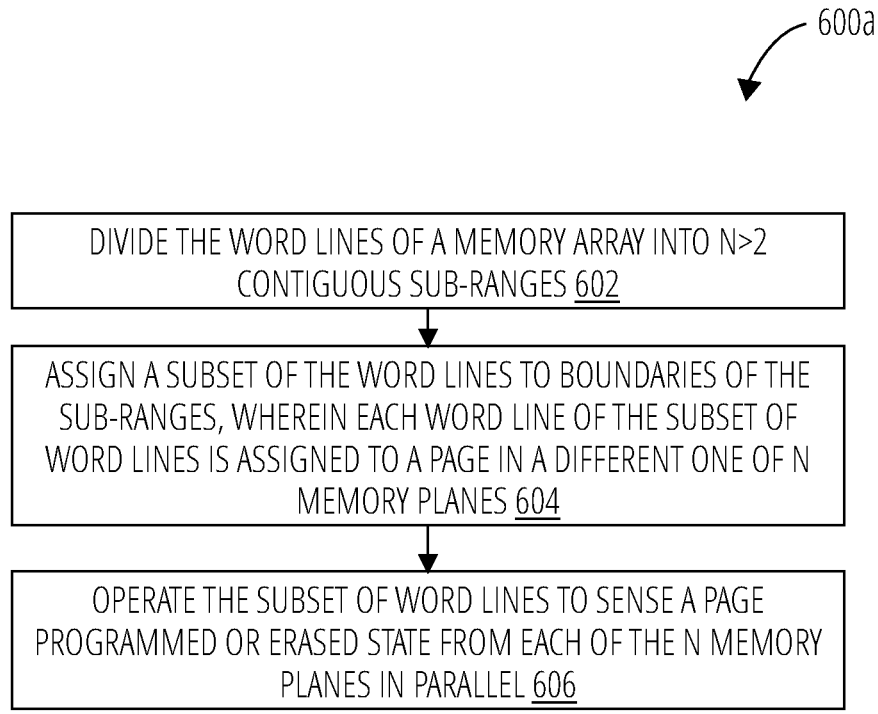
FIG. 6A depicts a memory search routine 600a in accordance with one embodiment.

FIG. 6A depicts a memory search routine 600*a* in one embodiment. The memory search routine 600*a* may be used to converge on the identity of a last word line programmed among a total set of word lines. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order.

At block 602, word lines of a memory array may be divided into R contiguous sub-ranges, where R is greater than two. This action and others of the memory search routine 600*a* may be carried out, for example, by the storage controller 104 or first introduced in FIG. 1 or the die controller 202 first introduced in FIG. 2. This action results in a number R of sub-ranges of word lines that may be further reduced in subsequent iterations.

At block 604, a subset of word lines may be assigned to boundaries of the sub-ranges. Each word line of the subset of word lines may be assigned to a page in a different one of P memory planes. This results in word lines at the boundaries of the R contiguous sub-ranges, with each word line assigned on a different memory plane, enabling multiple planes to be sensed quickly in accordance with this disclosure.

At block 606, the subset of word lines, assigned to the boundaries of the sub-ranges in block 604, are operated to sense a page programmed or erased state from each of the P memory planes in parallel. This enables the storage controller 104 or other functional element to determine in which of the R sub-ranges a last programmed page resides. The sub-range to analyze for the next iteration is selected from the R sub-ranges according to a decision tree. An example decision tree is depicted in FIG. 8B for a two-plane algorithm. It will be readily appreciated that this decision tree may be generalized for other numbers of planes (P).

Figure 6B:
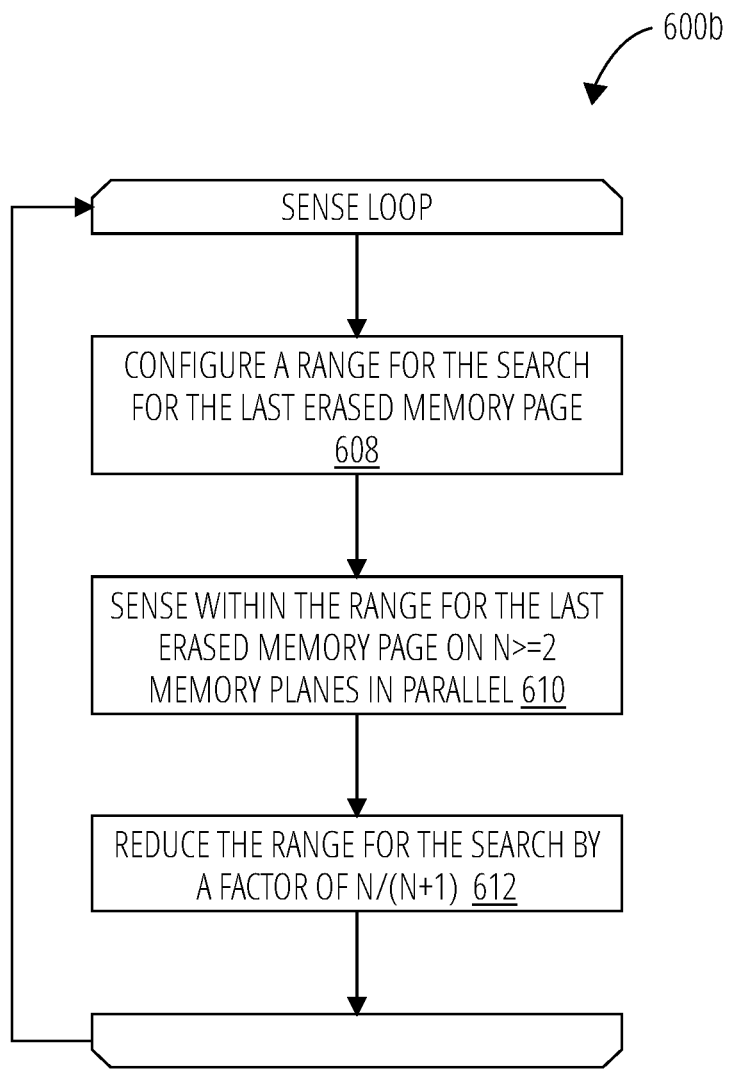
FIG. 6B depicts a memory search routine 600b in accordance with one embodiment.

FIG. 6B depicts a sense loop memory search routine 600*b* in one embodiment. The memory search routine 600*b* may be used to iteratively configure reduced ranges for sensing a last erased memory page in order to locate a last programmed memory page across multiple memory planes. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order.

At block 608, a range is configured in which to search for the last erased memory page. This and other actions of the memory search routine 600*c* may be carried, for example, by the storage controller 104 first introduced in FIG. 1 or the die controller 202 first introduced in FIG. 2. This action results in a range to be searched through sensing a programmed or erased memory state.

At block 610, the range configured in block 608 may be sensed for the last erased memory page on P≥2 memory planes in parallel. This may result in determining that the last erased memory page lies within the range or does not lie within the range.

At block 612, the range may be reduced for a subsequent search by a factor of P/(P+1). This may result in a reduced range for the next iteration of this loop. After this step, the memory search routine 600*b* may return to step block 608 for the next iteration.

Figure 6C:
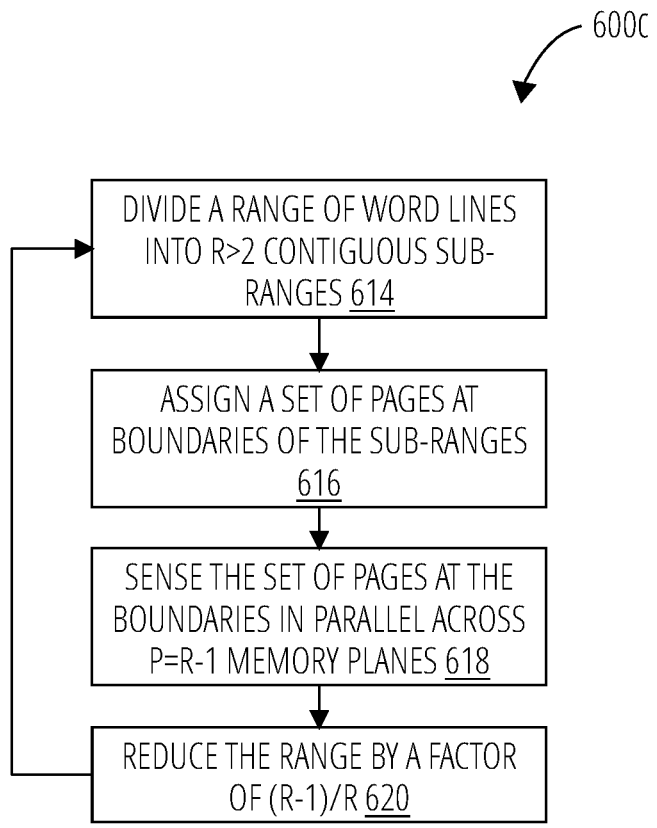
FIG. 6C depicts a memory search routine 600c in accordance with one embodiment.

FIG. 6C depicts a memory search routine 600*c* in one embodiment. The memory search routine 600*c* may be used to assign and iteratively narrow a set of boundaries for sensing a last programmed page. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order.

At block 614, a range of word lines may be divided into R>2 contiguous sub-ranges. This and other actions of the memory search routine 600c may be carried, for example, by the storage controller 104 first introduced in FIG. 1 or the die controller 202 first introduced in FIG. 2. This action results in a set of contiguous sub-ranges that may be sensed for page programmed or erased states.

At block 616, the R>2 contiguous sub-ranges may have set of pages (or word lines) assigned at their boundaries. This results in a set of boundaries at which sensing may be performed.

At block 618, the sets of pages assigned at sub-range boundaries in block 616 may be sensed in parallel across P memory planes, where P=R−1. As a result, it may be determined whether or not pages at the boundaries of each sub-range have been programmed or are in an erased state.

At block 620, the range of word lines addressed in block 614 may be divided by a factor of (R−1)/R. This may result in a reduced range of word lines to be addressed on the next iteration of memory search routine 600c. Block 620 results may be returned to block 614 once block 620 is complete.

Figure 6D:
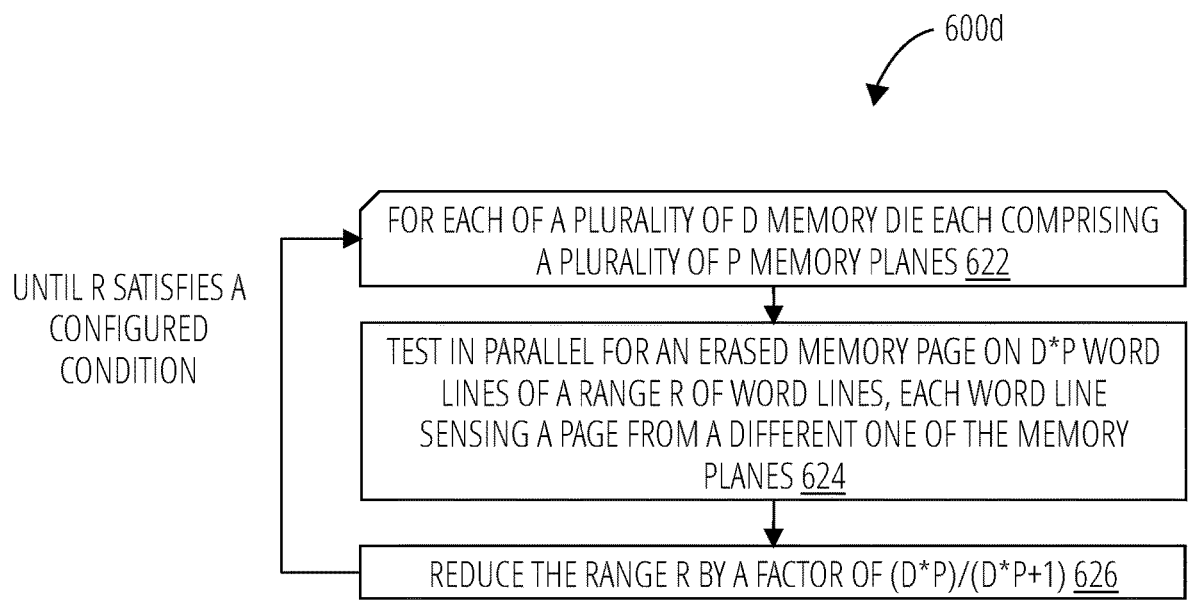
FIG. 6D depicts a memory search routine 600d in accordance with one embodiment.

FIG. 6D depicts a memory search routine 600d in one embodiment. The memory search routine 600d may be used to test for an erased memory page across multiple memory die. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order.

At opening loop block 622, each of a plurality of D memory die, each comprising a plurality of P memory planes, is considered. The memory die may be tested or sensed by action of, for example, the storage controller 104 introduced in FIG. 1 or the die controller 202 introduced in FIG. 2.

At block 624, D*P word lines of a range R of word lines may be tested in parallel for an erased memory page. Each word line may sense a page from a different one of the P memory planes across the D memory die.

At block 626, the range of R word lines may be reduced by a factor of (D*P)/(D*P+1). This action results in a reduction of the range or word lines to be sensed in the next iteration of memory search routine 600d. Once the action of block 626 is complete, memory search routine 600d may return to opening loop block 622. This iteration may be performed until R satisfies a configured condition.

Figure 7A:
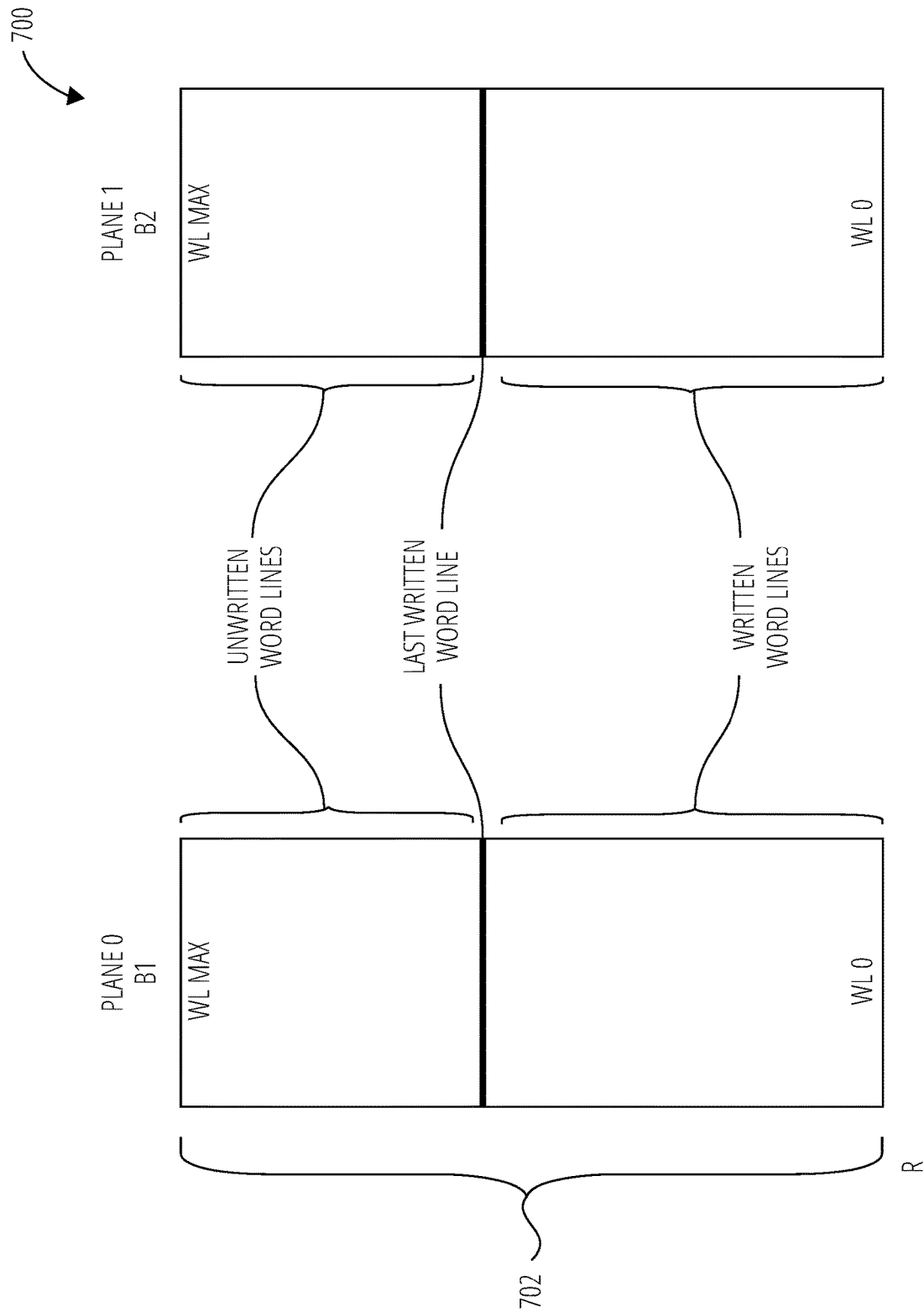
FIG. 7A depicts a memory range 700 in accordance with one embodiment.
Figure 7B:
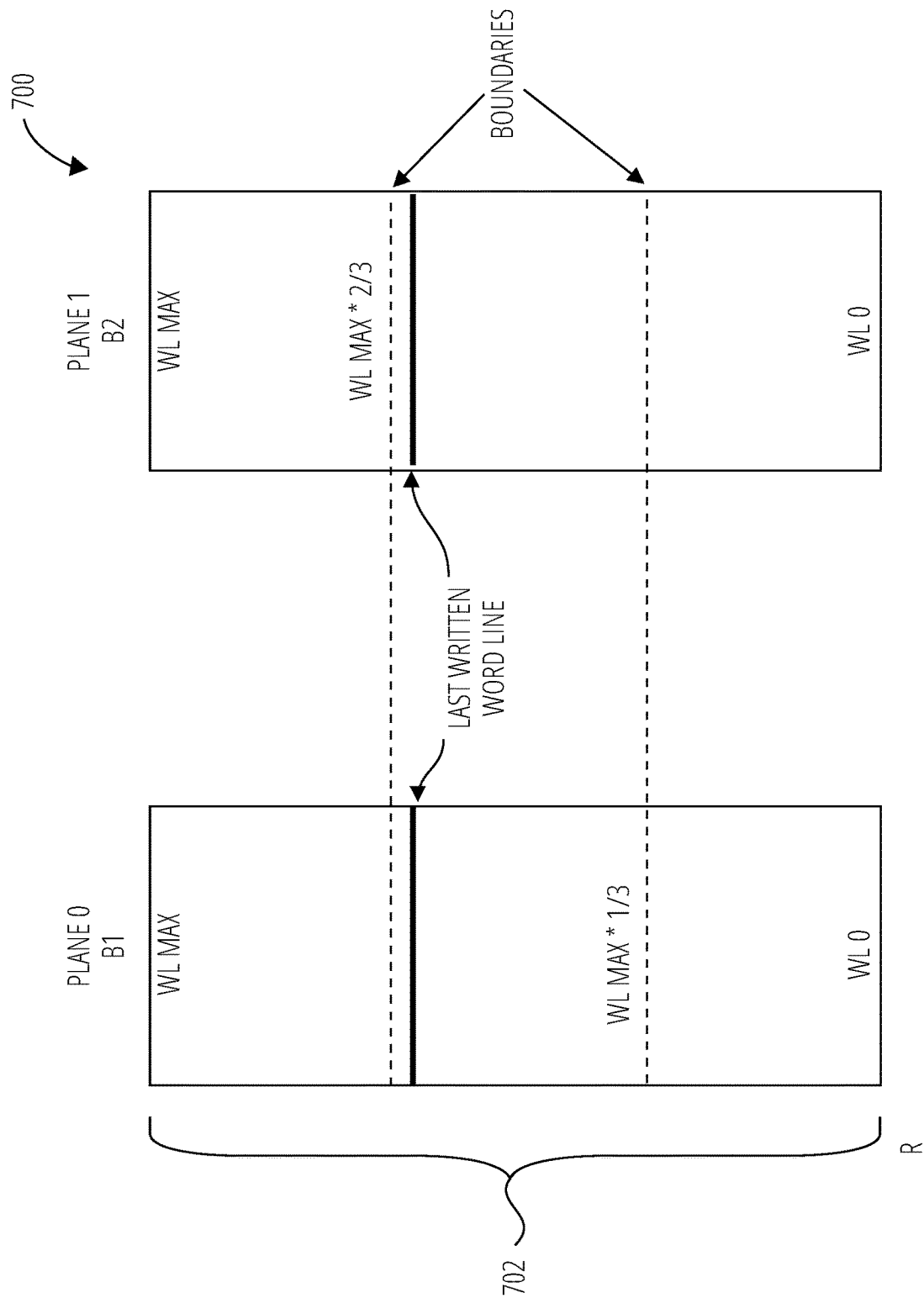
FIG. 7B depicts a memory range partitioning 700 in accordance with one embodiment.
Figure 7C:
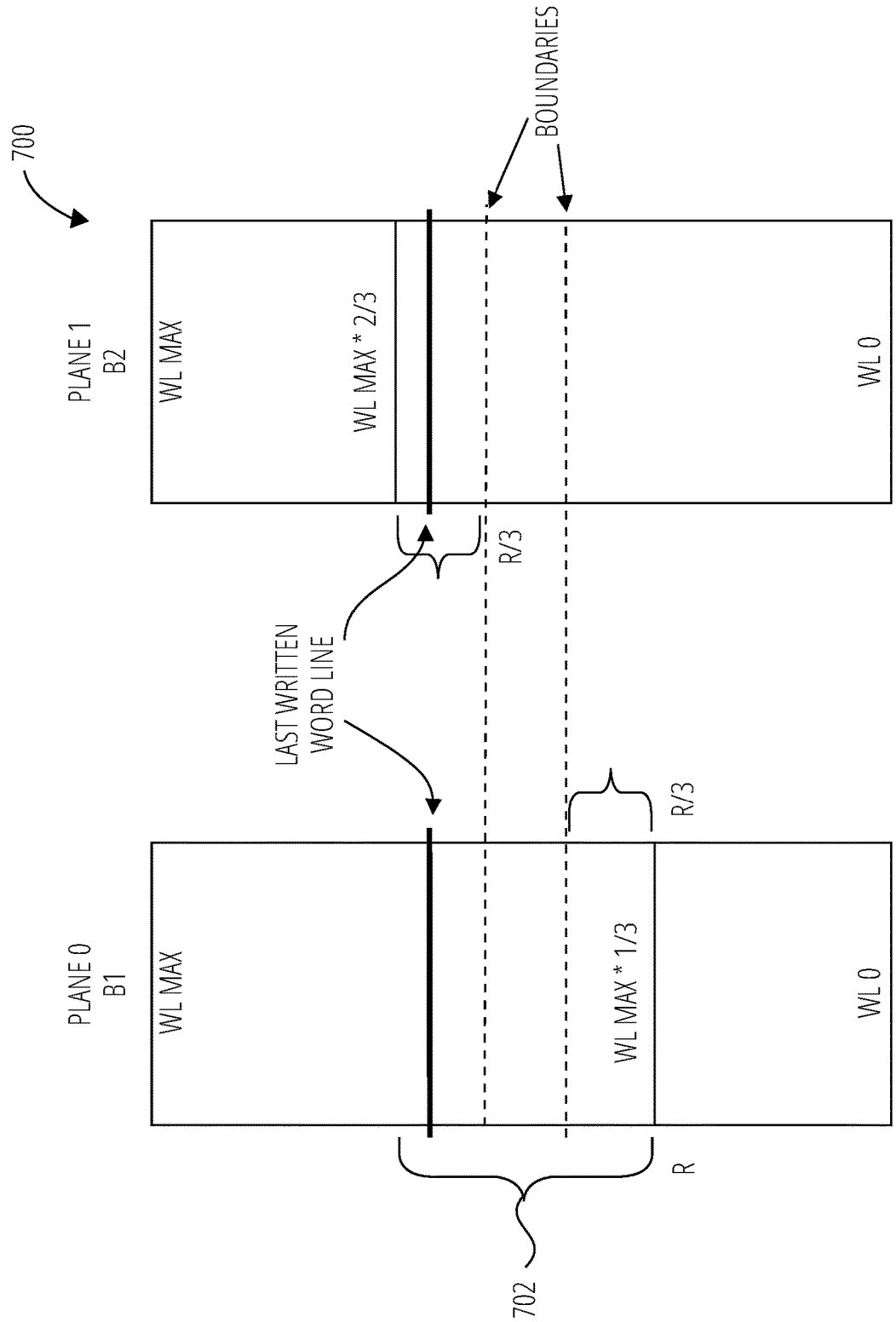
FIG. 7C depicts a memory range partitioning 700 in accordance with one embodiment.

FIG. 7A, FIG. 7B, and FIG. 7C depict search range reduction for a storage block spanning P=2 memory planes, or a physical block duplicated on two memory planes, in various iterations: pre-search memory range 700, initial iteration memory range partitioning 700, and memory range partitioning 700 after one iteration. Two memory blocks are depicted, B1 and B2, each on separate memory plane. A word line index, WL Max, identifies the maximum word line, by index, in the memory array implementation. A word line index, WL 0, identifies a lowest word line, by index, in the memory array. The blocks B1 and B2 are assumed to have been programmed in an order starting from WL 0 toward increasing word line index.

In each iteration two different word lines are checked, one on either of the planes. The first iteration reads the word line at index Sense1 for B1 and the word line at index Sense2 on B2. At the start of the first iteration, the pointer start is set to WL 0 and the pointer end is set to WL Max. The index of the word line to read on B1 (Sense1) is start+⅓*(end-start). For B2, the value of the word line to read (Sense2) is set to start+⅔*(end-start). This results in three memory range partitions: from WL 0 to ⅓WL Max, from ⅓WL Max to ⅔ WL Max, and from ⅔ WL Max to WL Max, one of which is selected for the next iteration. After a single iteration the search range 702 for the last-programmed word line/page has been reduced by ⅔.

The readings from the word lines at indexes Sense1 and Sense2 may result in one of the following:
1. The pages at Sense1 and Sense2 are both erased.
2. The pages at Sense1 and Sense2 are both programmed.
3. The page at Sense1 is programmed and the page at Sense2 is erased.
4. The page at Sense2 is programmed and the page at Sense1 is erased. This may be treated as a degenerate condition since word lines are assumed to be programmed from lower indexes to higher indexes. The procedure may fall back to perform an alternative search process and possibly remediation of errors in this case. The type of alternative search performed will depend on the nature of the device and the organization of the memory.

As mentioned this algorithm may be generalized to P>2 memory planes.

Figure 8A:
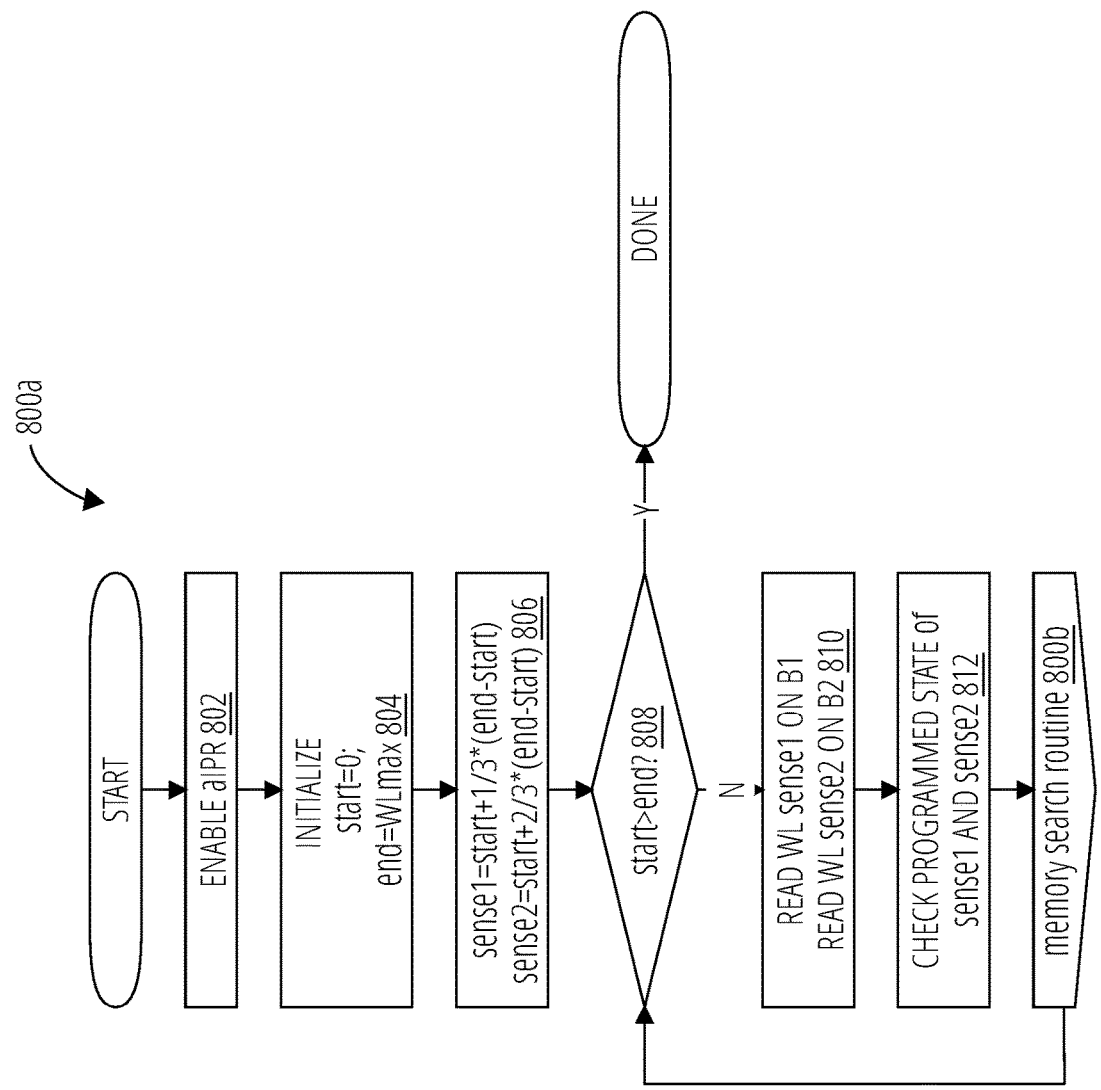
FIG. 8A depicts a memory search routine 800a in accordance with one embodiment.
Figure 8B:
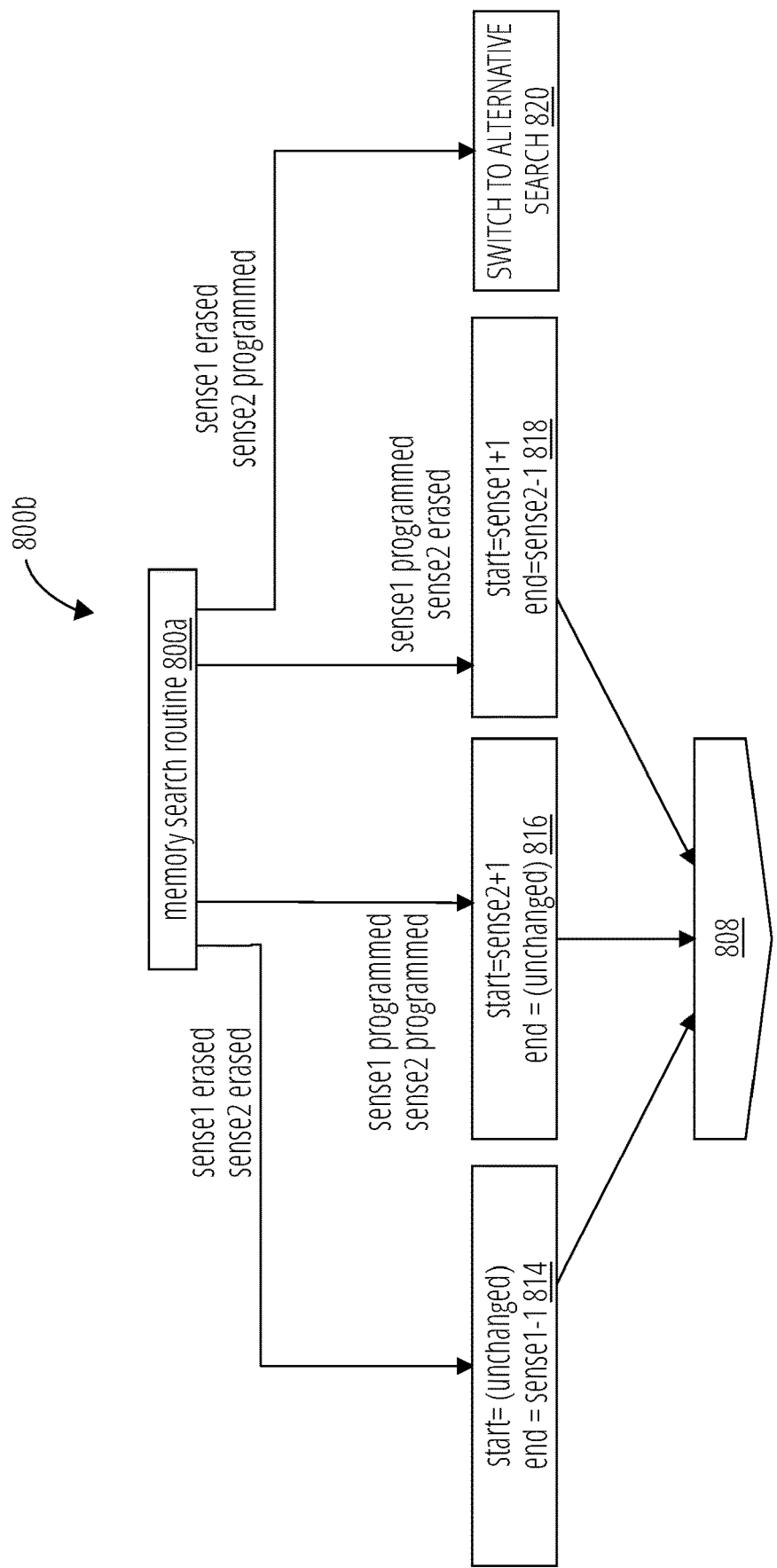
FIG. 8B depicts a memory search routine 800b in accordance with one embodiment.

FIG. 8A depicts an embodiment of a memory search routine 800a for a block (or block and duplicate block) spanning two memory planes. The memory search routine 800a in conjunction with memory search routine 800b may be used to identify a last programmed word line with reduced execution complexity over binary search approaches. These routines may be performed by the storage controller 104 or die controller 202. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order.

At block 802, an asynchronous independent plane read (aIPR) process on two memory planes may be enabled by the storage controller 104 or die controller 202. This enables planes on a memory die to be read asynchronously and independently, which may represent a significant time savings in relation to binary search approaches (for a visual comparison, see FIG. 9).

At block 804, a "start" variable is initialized to zero and an "end" variable is initialized to the maximum word line value, WLmax. For example, for a memory comprising forty-eight word lines, the first word line may be represented by 0, for the start value, and the last word line may be expressed as WLmax=47 for the end value. (The number 48 is merely an example; memory devices may for example have more word line than this, e.g., 96 word lines).

At block 806, a "sense1" variable may be initialized to start+⅓*(end-start), and a "sense2" variable may be initialized to start+⅔*(end-start). This step provides two sense points at which to begin sensing for a programmed/erased state. Continuing with the forty-eight word line example, sense1≈15.667, which may be rounded to 16, and sense2≈31.333, which may be rounded to 31. These values may correspond to a word line location to be used for each sense step.

At decision block 808, the start and end variables are compared to determine if start>end. This test results in either a determination that start is greater than end (Y), or a determination that start is less than or equal to end (N). If the outcome of the test is the former, the memory search routine 800a proceeds to the "DONE" block and is complete. If the outcome of the test is the latter, the memory search routine 800a proceeds to block 810.

It will be appreciated that the memory search routine 800a may end based on other conditions, depending on the specific manner in which it iterates and the location of the last programmed word line. For example there may be situations in which start=end=0 or start=end=WLmax may end the memory search routine 800a. It will be apparent that once the last programmed word line is identified, it is straight forward to identify the last programmed page, plane, die, flash interface module, and so on.

At block 810, WL(sense1) may be read on B1, B1 being a first block on a first plane of memory, as illustrated in FIG. 7A, and WL(sense2) may be read on B2, B2 being a second block on a second memory plane, shown in that same figure. This read may detect a programmed or erased state on WL(sense1) of B1 and WL(sense2) of B2. For example, this read may determine whether or not WL16 on B1 and WL31 on B2 have been programmed, B1 and B2 being memory blocks comprising forty-eight word lines.

At block 812, the programmed state of the word lines at sense1 and sense2 is checked. The detected states at sense1 and sense2 (e.g., WL 16 and WL31), may be used in completing the steps of memory search routine 800b which follow, and are described with respect to FIG. 8B below.

FIG. 8B depicts a memory search routine 800b in one embodiment. The memory search routine 800b may be used as a decision tree based on values of sense1 and sense2 provided by memory search routine 800a to determine an action to take in locating a last programmed page in memory. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order.

If both sense 1 and sense 2 indicate an erased state, block 814 may be performed. At this step, the start variable may remain unchanged from its initialized value from block 804 in memory search routine 800a (e.g., 0). The end variable may be set to sense 1 (e.g., 15 for a forty-eight word line memory block).

If sense1 and sense2 both indicate a programmed state, block 816 may be performed by the storage controller 104 or die controller 202, for example. At this step, the start variable may be set to sense2+1 (e.g., 32 for a forty-eight word line memory block). The end variable may remain unchanged from its initialized value from block 804 (e.g., 47 for a forty-eight word line memory block).

If sense1 indicates a programmed state and sense 2 indicates an erased state, block 818 may be performed by the storage controller 104 or die controller 202. The start variable may be set to equal sense1+1 (e.g. 16 for a forty-eight word line memory block), and the end variable may be set to equal sense2−1 (e.g. 30 for a forty-eight word line memory block).

If sense 1 indicates an erased state and sense2 indicates a programmed state, the memory search routine 800b may proceed to block 820 to switch to performing an alternative search or other conventional search technique in response to this condition.

In one embodiment, block 814, block 816, and block 818 may produce updated values that may be applied back to the decision block 808 of memory search routine 800a.

Figure 9:
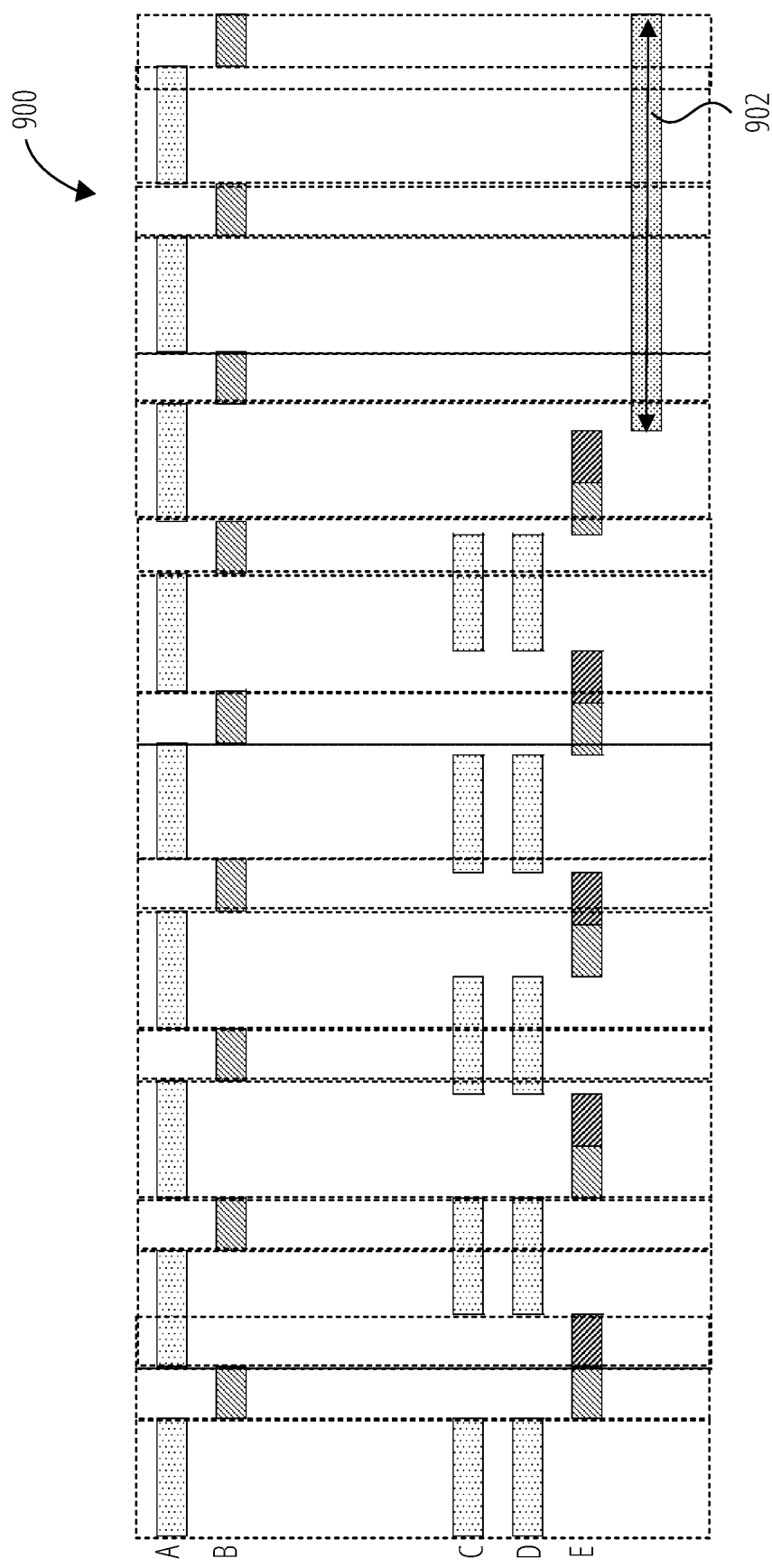
FIG. 9 depicts a timing diagram 900 in accordance with one embodiment.

FIG. 9 depicts a timing diagram 900 for a binary search for a last-programmed memory page compared with a two-plane search utilizing the techniques described herein.

For the binary search approach, Row A depicts timing for sense operations and Row B depicts the corresponding timing to transfer the data to the storage controller or die controller for analysis.

Utilizing the approaches described herein on two memory planes, Row C depicts the sense operations performed on a first memory plane and Row D depicts the sense operations performed in parallel on a second memory plane. Row E depicts the corresponding timing to transfer the data from the first memory plane to the storage controller or die controller (blocks with lighter hatching) for analysis and the corresponding timing to transfer the data from the second memory plane to the storage controller or die controller (blocks with darker hatching). The latter approach results in a latency improvement 902 over the binary approach.

Those of ordinary skill in the art will appreciate that the techniques disclosed herein and variations thereof may be performed by various forms of logic as suited to the particulars of the implementation. Herein the term "logic" refers to machine memory circuits, non-transitory machine readable media, and/or circuitry which by way of its material and/or material-energy configuration includes control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processors" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A device, comprising:
   a memory array including a plurality of planes;
   a plurality of word lines operable on the memory array; and
   a storage controller configured to:
   divide the word lines into R>2 contiguous sub-ranges, wherein R is a number of the contiguous sub-ranges;
   assign a subset of the word lines to boundaries of the sub-ranges, wherein each word line of the subset of word lines is assigned to a page in a different one of P=R−1 memory planes, wherein P is a number of planes, and wherein P is greater than 1; and
   operate the subset of word lines to sense a page programmed or erased state from each of the P memory planes in parallel.

2. The device of claim 1, wherein a first physical page on a first memory plane and a second physical page on a second memory plane defines a sub-range.

3. The device of claim 1, the storage controller further configured to:
   reduce a total range of the sub-ranges by a factor of P/R to generate a reduced range of word lines; and
   divide the reduced range of word lines into R contiguous sub-ranges.

4. The device of claim 1, the storage controller further configured to switch to performing an alternative search of the plurality of word lines upon detection of a predetermined degenerate condition.

5. The device of claim 1, the storage controller further configured to execute a sense loop to:
   sense each of the subset of word lines for a last erased memory page on the P memory planes in parallel; and
   reduce a extent of the sub-ranges by P/R on each iteration of the sense loop.

6. The device of claim 5, the storage controller further configured to: change at least one of the boundaries of the sub-ranges on each iteration of the sense loop.

7. The device of claim 5, the storage controller further configured to:
   terminate the sense loop when the extent of the sub-ranges satisfies a configured extent.

8. A method, comprising:
   dividing a range of memory pages into R>2 contiguous sub-ranges, wherein R is a number of the contiguous sub-ranges;
   assigning a set of pages at boundaries of the sub-ranges;
   operating a storage controller to sense the set of pages at the boundaries across P=R−1 memory planes in parallel, wherein P is a number of planes, and wherein P is greater than 1; and
   reducing the range by a factor of P/R.

9. The method of claim 8, wherein each of the boundaries of the sub-ranges is assigned to different one of the memory planes.

10. The method of claim 8, wherein the pages are programmed contiguously in a sequential order.

11. The method of claim 8, wherein:
    the range includes $T_p$ pages; and
    each of the sub-ranges includes $T_p/R$ pages.

12. The method of claim 8, wherein each of the pages in the set of pages is a physical page of a logical page in a memory meta-block.

13. The method of claim 8, wherein a first page on a first memory plane and a second page on a second memory plane defines a sub-range.

14. The method of claim 8, wherein the memory planes are distributed across a plurality of memory die.

15. A memory system, comprising:
    a plurality of D memory die, each of the D memory die including a plurality of P memory planes; and
    logic configured to:
    test in parallel for either a programmed state or an erased state of a memory page on D*P word lines of a range R of word lines, each word line sensing a page from a different one of the memory planes;
    reduce the range R by a factor of (D*P)/(D*P+1); and
    repeat the test step and the reduce step until R satisfies a configured condition.

16. The memory system of claim 15, wherein the logic is further configured to:
    operate each of the word lines to sense a physical page at a boundary of a configured sub-range of the range.

17. The memory system of claim 15, wherein pages of each of the memory planes are programmed contiguously in a same sequential order.

18. The memory system of claim 15, wherein the configured condition is that R is empty.

19. The memory system of claim 15, wherein pages from the different memory planes form a logical page.

20. The memory system of claim 15, wherein the pages from the different memory planes form a memory meta-block.

* * * * *